(12) United States Patent
Chang et al.

(10) Patent No.: US 11,996,137 B2
(45) Date of Patent: May 28, 2024

(54) COMPUTE IN MEMORY (CIM) MEMORY ARRAY

(71) Applicant: Taiwan Semiconductor Manufacturing Company, Ltd., Hsinchu (TW)

(72) Inventors: Yen-An Chang, Miaoli County (TW); Yu-Lin Chen, Tainan (TW); Chia-Fu Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 216 days.

(21) Appl. No.: 17/561,106

(22) Filed: Dec. 23, 2021

(65) Prior Publication Data

US 2022/0375508 A1    Nov. 24, 2022

Related U.S. Application Data

(60) Provisional application No. 63/191,635, filed on May 21, 2021.

(51) Int. Cl.
*G11C 11/4091* (2006.01)
*G06F 7/523* (2006.01)
*G11C 11/4094* (2006.01)
*G11C 11/4096* (2006.01)

(52) U.S. Cl.
CPC .......... *G11C 11/4091* (2013.01); *G06F 7/523* (2013.01); *G11C 11/4094* (2013.01); *G11C 11/4096* (2013.01)

(58) Field of Classification Search
CPC ... G11C 11/4091; G11C 11/54; G11C 7/1006; G11C 11/4096; G11C 11/4094; G06F 7/523
See application file for complete search history.

(56) References Cited

U.S. PATENT DOCUMENTS

| | | | | |
|---|---|---|---|---|
| 6,208,575 | B1 * | 3/2001 | Proebsting | H10B 12/50 365/207 |
| 7,603,592 | B2 * | 10/2009 | Sekiguchi | G06F 11/1044 714/763 |
| 7,660,173 | B2 * | 2/2010 | Song | G11C 29/46 365/201 |
| 9,177,624 | B1 * | 11/2015 | Wu | G11C 29/028 |
| 2008/0279017 | A1 * | 11/2008 | Shimano | G11C 5/14 365/230.03 |
| 2010/0097840 | A1 * | 4/2010 | Kim | G11C 11/22 365/194 |

* cited by examiner

*Primary Examiner* — Tuan T Nguyen
(74) *Attorney, Agent, or Firm* — MERCHANT & GOULD P.C.

(57) ABSTRACT

A memory device for CIM has a memory array including a plurality of memory cells arranged in an array of rows and columns. The memory cells have a first group of memory cells and a second group of memory cells. Each row of the array has a corresponding word line, with each memory cell of a row of the array coupled to the corresponding word line. Each column of the array has a corresponding bit line, with each memory cell of a column of the array coupled to the corresponding bit line. A control circuit is configured to select the first group of memory cells or the second group of memory cells in response to a group enable signal.

20 Claims, 7 Drawing Sheets

COMPUTE IN MEMORY (CIM) MEMORY ARRAY

CROSS-REFERENCE TO RELATED APPLICATIONS

This application claims the benefit of U.S. Provisional Patent Application No. 63/191,635, filed May 21, 2021, entitled, "COMPUTE IN MEMORY STORAGE DEVICE." The disclosure of this priority application is hereby incorporated by reference in its entirety into the present application.

BACKGROUND

This disclosure relates generally to in-memory computing, or compute-in-memory ("CIM"), and further relates to memory arrays used in data processing, such as multiply-accumulate ("MAC") operations. Compute-in-memory or in-memory computing systems store information in the main random-access memory (RAM) of computers and perform calculations at memory cell level, rather than moving large quantities of data between the main RAM and data store for each computation step. Because stored data is accessed much more quickly when it is stored in RAM, compute-in-memory allows data to be analyzed in real time, enabling faster reporting and decision-making in business and machine learning applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure relates generally to computing-in-memory ("CIM"). An example of applications of CIM is multiply-accumulate ("MAC") operations. Computer artificial intelligence ("AI") uses deep learning techniques, where a computing system may be organized as a neural network. A neural network refers to a plurality of interconnected processing nodes that enable the analysis of data, for example. Neural networks compute "weights" to perform computation on new input data. Neural networks use multiple layers of computational nodes, where deeper layers perform computations based on results of computations performed by higher layers.

Machine learning (ML) involves computer algorithms that may improve automatically through experience and by the use of data. It is seen as a part of artificial intelligence. Machine learning algorithms build a model based on sample data, known as "training data" in order to make predictions or decisions without being explicitly programmed to do so.

Neural networks may include a plurality of interconnected processing nodes that enable the analysis of data to compare an input to such "trained" data. Trained data refers to computational analysis of properties of known data to develop models to use to compare input data. An example of an application of AI and data training is found in object recognition, where a system analyzes the properties of many (e.g., thousands or more) of images to determine patterns that can be used to perform statistical analysis to identify an input object.

As noted above, neural networks compute weights to perform computation on input data. Neural networks use multiple layers of computational nodes, where deeper layers perform computations based on results of computations performed by higher layers. Machine learning currently relies on the computation of dot-products and absolute difference of vectors, typically computed with MAC operations performed on the parameters, input data and weights. The computation of large and deep neural networks typically involves so many data elements it is not practical to store them in processor cache, and thus they are usually stored in a memory.

Thus, machine learning is very computationally intensive with the computation and comparison of many different data elements. The computation of operations within a processor is orders of magnitude faster than the transfer of data between the processor and main memory resources. Placing all the data closer to the processor in caches is prohibitively expensive for the great majority of practical systems due to the memory sizes needed to store the data. Thus, the transfer of data becomes a major bottleneck for AI computations. As the data sets increase, the time and power/energy a computing system uses for moving data around can end up being multiples of the time and power used to actually perform computations.

CIM circuits thus perform operations locally within a memory without having to send data to a host processor. This may reduce the amount of data transferred between memory and the host processor, thus enabling higher throughput and performance. The reduction in data movement also reduces energy consumption of overall data movement within the computing device.

Such CIM devices may include a memory array with memory cells configured to store weight signals, and an input driver provides input signals. The CIM device is configured to perform a logical operation on selected weight signals and the input signals, for example, the selected weight signal may be multiplied by the input signal. A multiply and accumulation (or multiplier-accumulator) circuit performs MAC operations, where each MAC operation computes a product of two numbers and adds that product to an accumulator (or adder). In some embodiments, a processing device or a dedicated MAC unit or device may contain MAC computational hardware logic that includes a multiplier implemented in combinational logic followed by an adder and an accumulator that stores the result. The output of the accumulator may be fed back to an input of the adder, so that the output of the multiplier is added to the accumulator. Example processing devices include, but are not limited to, a microprocessor, a digital signal processor, an application-specific integrated circuit, and a field programmable gate array.

Some weight storage arrangements for CIM may have a limited weight storage density due to the use of a large memory cells, which also may result in limited write throughput. Some disclosed embodiments employ a one-transistor one-capacitor (1T-1C) based weight storage for CIM which may increase weight storage density by using a small area memory cell and further may increase weight storage array write throughput. Further, some examples include a "multi-select" weight storage array that facilitates selecting among a plurality of memory array groups, allowing different operations (e.g. read or write) to be performed on the selected memory array groups. Moreover, such different operations may be conducted simultaneously on the selected memory array groups. Such a selective weight storage array facilitates multitasking and increases weight storage array write throughput.

For instance, the memory array groups may include first and second selective groups, where the first group includes even numbered columns of the array and the second group includes odd numbered columns of the array. CIM weight values may be selectively written to one or both of the first (even) group and/or the second (odd) group in response to a group enable signal. Further, CIM weight values may be selectively read from one or both of the first (even) group and/or the second (odd) group in response to the group enable signal. Still further, CIM weight values may be selectively written to one of the first (even) group or the second (odd) group while CIM weight values may be selectively read from the other of the first (even) group or the second (odd) group in response to the group enable signal. The number of memory array groups is not limited to two groups; other embodiments may include more than two memory array groups.

Figure 1:
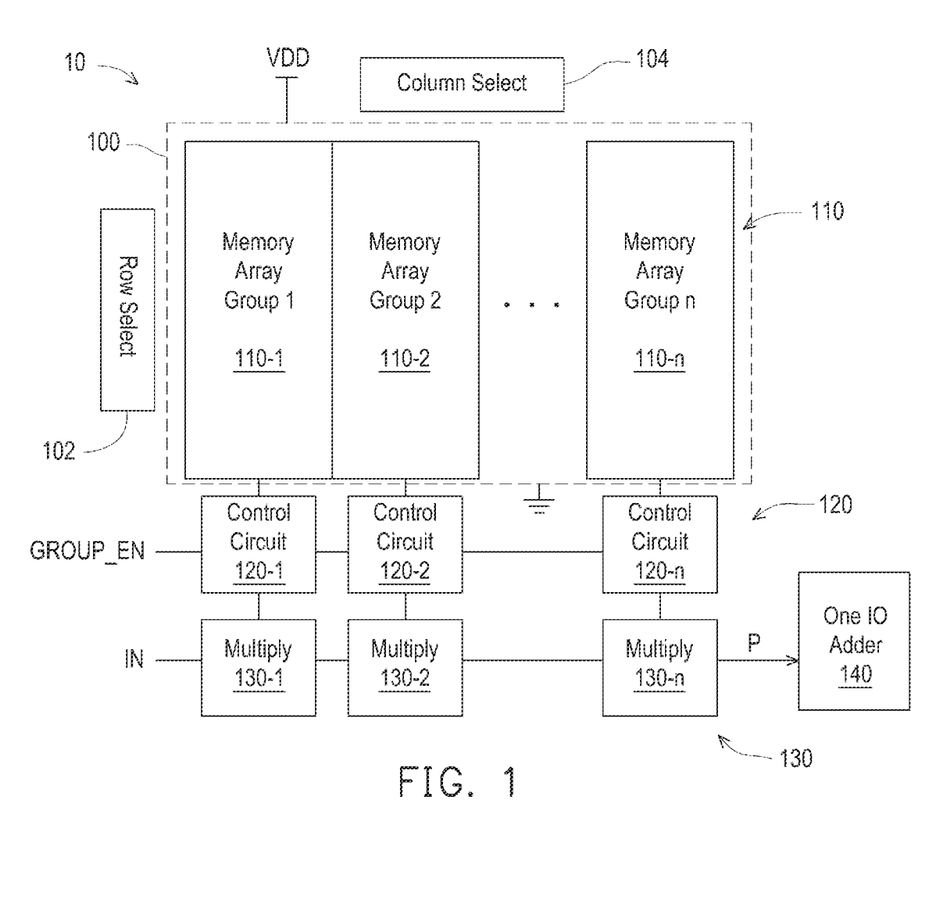
FIG. 1 is a block diagram illustrating an example of aspects of a compute-in-memory (CIM) device in accordance with some embodiments.

FIG. 1 illustrates a CIM device 10 in accordance with some disclosed embodiments. The CIM device 10 includes a CIM memory array 100 with a plurality of memory cells configured to store CIM weight signals. The memory array 100 and associated components and circuits may be connected between a power terminal configured to receive a VDD voltage and a ground terminal. As will be discussed further below, the memory cells are arranged in an array of rows and columns, and includes a plurality of memory array groups 110. A row select circuit 102 and column select circuit 104 are connected to the memory array 100 and are configured to select the memory cells in desired rows and columns of the array for read and write operations.

In the example shown in FIG. 1, the memory array 100 includes a first memory array group 110-1, a second memory array group 110-2, and so on through a memory array group n 110-n. A control circuit 120 is connected to the bit lines and configured to select the first group of memory cells or the second group of memory cells in response to a group enable signal. In the illustrated example, the control circuits 120 include control circuits 120-1, 120-2 . . . 120-n connected respectively to the memory array groups 110-1, 110-2 . . . 110-n.

An input terminal is configured to receive a CIM input signal IN, and a multiply circuit 130 is configured to multiply the selected weight signals stored in the memory array 100 by the input signals IN to generate a plurality of partial products P. In the illustrated embodiment, the multiply circuits 130 include multiply circuits 130-1, 130-2 . . . 130-n. The partial products P are output to a one 10 adder circuit 140 that is configured to add the partial products P to produce a CIM output.

Figure 2:
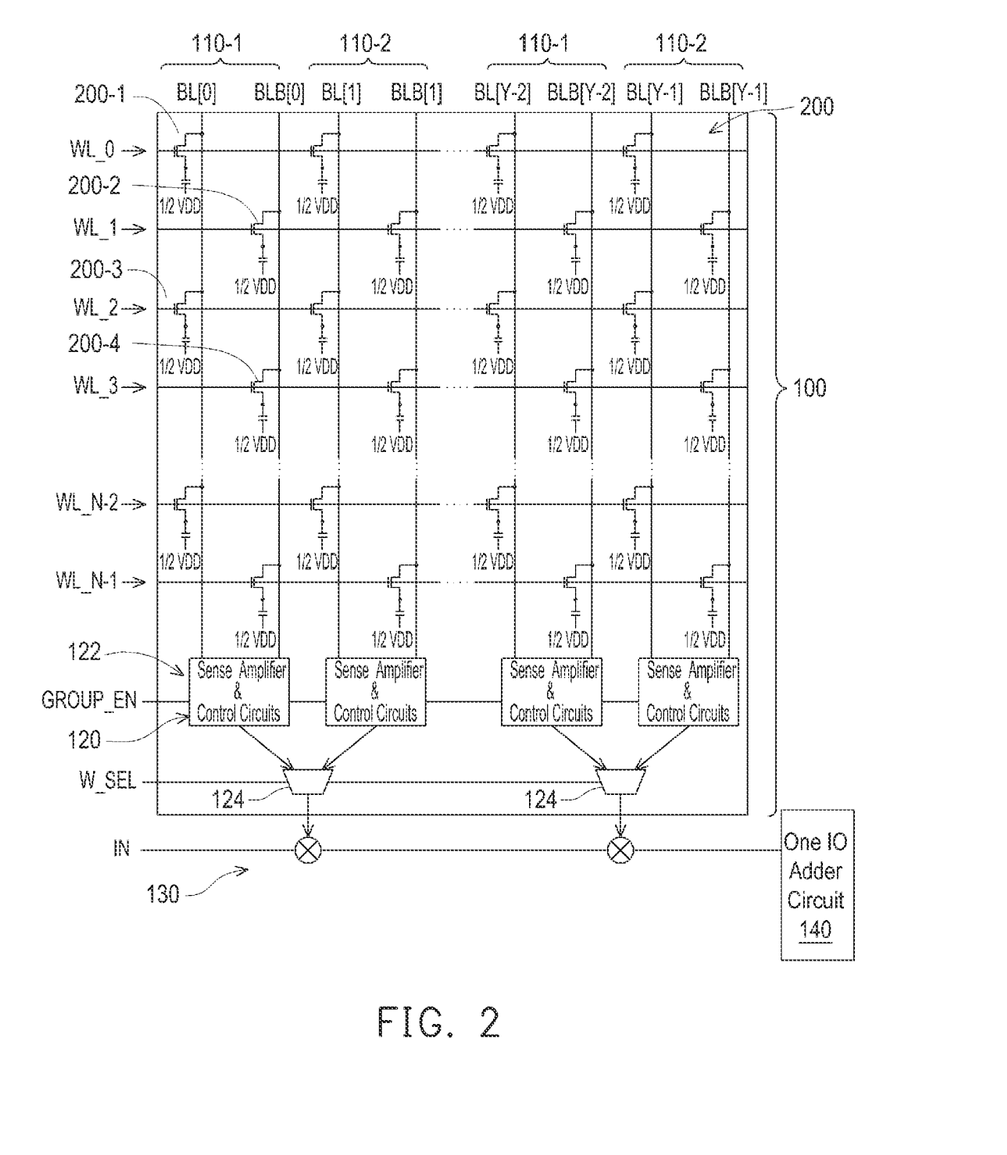
FIG. 2 is a schematic diagram illustrating an example of a CIM memory array in accordance with some embodiments.

FIG. 2 illustrates further aspects of an example of the memory array 100. As noted above in conjunction with FIG. 1, the CIM memory array 100 includes a plurality of memory cells 200 arranged in rows and columns. Each row of the array 100 has a corresponding word line WL. In the illustrated example, the array 100 has N rows. Accordingly, the word lines shown in FIG. 2 are designated as word lines WL_0 through WL_N-1. Each memory cell 200 is coupled to the word line WL of its corresponding row. Each column of the array 100 has corresponding bit lines BL/BLB. In the illustrated example, the array 100 has Y columns. Accordingly, the bit lines shown in FIG. 2 are designated as bit lines BL[0] through BL[Y-1] and BLB[0] through BLB[Y-1]. Each memory cell 200 is coupled to its corresponding bit line BL/BLB. The word lines WL and bit lines BL/BLB may include a conductive trace or line formed by a conductive material such as metal or silicided/polycided polysilicon, for example.

Sense amplifiers 122 and the control circuits 120 are connected to the bit lines BL/BLB of each column of the array 100. Multiplexers (MUX) 124 are connected to the outputs of the sense amplifiers 122, and in response to a weight select signal W_SEL, output the desired weight signals stored in the memory array 100 to the multiply circuits 130. The example shown in FIG. 2 has the memory array 100 arranged in two memory array groups 110-1 and 110-2, with the first group 110-1 including the even columns (i.e. containing even numbered bit lines BL[0]/BLB[0] and so on to BL[Y-2]/BLB[Y-2]), and with the second group 110-2 including the odd columns (i.e. containing odd numbered bit lines BL[1]/BLB[1] and so on to BL[Y-1]/BLB[Y-1]). As will be discussed further below, the control circuits 120 are configured to select the first group 110-1 of memory cells or the second group 110-2 of memory cells in response to the group enable signal GROUP_EN.

CIM weight signals are stored in the memory array 100. Each cell 200 in the array 10 stores a single bit of data (i.e., a logic one or zero). In the illustrated example, the weight cells are 1T-1C memory cells in which the single bit of data is stored as a charge on a capacitor. Other embodiments may use memory cells other than 1T-1C memory cells.

Figure 3:
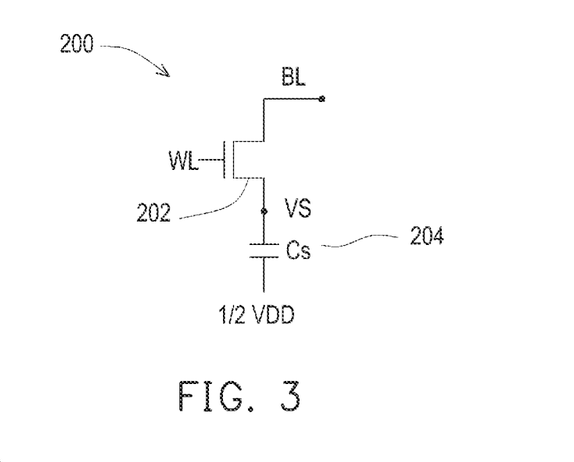
FIG. 3 is a schematic diagram illustrating an example of a CIM memory cell in accordance with some embodiments.

FIG. 3 illustrates an example of the 1T-1C memory cell 200 of the memory array 100 shown in FIG. 2. The memory cell 200 has one transistor, such as a MOS transistor 202 and one storage capacitor 204. The transistor 202 operates as a switch, interposed between the storage capacitor 204 and the bit line BL (or BLB), with a first source/drain terminal (S/D) of the transistor 202 connected to the bit line BL/BLB and a second S/D terminal of the transistor 202 connected to a first terminal of the capacitor 204. A second terminal of the capacitor 204 is connected to a voltage terminal configured to receive a voltage level of ½VDD. In some examples, the VDD voltage level is 1.0V, though other embodiments may employ different VDD voltage levels depending on, for example, the particular process technology. The memory cell 200 is capable of storing a single piece of binary information as stored electric charge in the capacitor 204.

The transistor 202 has its gate terminal connected to a word line WL. As shown in FIG. 2, each of the word lines WL is connected to a plurality of memory cells 200, with each row of the array 100 having a corresponding WL. In some implementations, the gate terminal of the transistor 200 may be an extended segment of the same conductive material (e.g. metal or polysilicon) that is used to form the word line WL.

As shown in FIG. 2, each column of the memory array 100 includes two bit lines—i.e. BL/BLB. Thus, the first column of the memory array 100 includes BL[0] and BLB[0], the second column of the memory array includes BL[1] and BLB[1], and so on through the Yth column, which includes BL[Y-1] and BLB[Y-1]. Each bit line BL/BLB is connected to every other memory cell 200 in a given column. Thus, a first memory cell 200-1 shown in the leftmost column of the memory array 100 is connected to the bit line BL[0], a second memory cell 200-2 is connected to the bit line BLB[0], a third memory cell 200-3 is connected to the bit line BL[0], a fourth memory cell 200-4 is connected to the bit line BLB[0], and so on.

Each column of the array 100 has a sense amplifier 122 connected to the bit lines BL/BLB of its respective column. The sense amplifiers 122 include a pair of cross-connected inverters between the bit lines BL/BLB, with the first inverter connected with input from the bit line BL and output to the bit line bar BLB. The second inverter receives input from the corresponding bit line bar BLB with its output to the bit line BL. This results in positive feedback which stabilizes after one of the bit lines BL/BLB is fully at its highest voltage and the other bit line BL/BLB is at the lowest possible voltage.

In general, for a read operation the sense amplifiers 122 are effectively disabled or disconnected from the respective bit lines BL/BLB. In some examples, the sense amplifiers are controlled by the control circuits 120 in response to the group enable signal GROUP_EN. The bit-lines are pre-charged to a voltage level between high (i.e. logic 1) and low (i.e. logic 0) logic levels. In the illustrated example, the logic 0 voltage level may be 0 V, while the logic 1 voltage level may be the VDD voltage level. Accordingly, the bit line precharge voltage level is ½ VDD.

A desired word line and bit line are selected, and the word line WL for the selected row is then driven high (assuming the memory cell 200 transistor 202 is an NMOS transistor) to turn on the transistor 202 and connect the storage capacitor 204 of the memory cell 200 to its bit line BL/BLB. This transfers charge from the memory cell 200 to the connected bit line BL/BLB if the stored value is 1, or from the connected bit line BL/BLB to the storage cell 200 if the stored value is 0.

Conventional memory arrays may have very long bit lines, resulting in the bit lines having high capacitance. Further, 1T-1C memory cells of such conventional arrays may be connected between VDD and ground, rather than VDD and ½ VDD as in the illustrated embodiments. Connecting the storage capacitor 204 to ½ VDD (rather than ground) reduces the voltage swing of the storage capacitor 204 from VDD to ½ VDD. This further results in a smaller access power as compared to a full ground to VDD voltage swing. In some examples, the VDD voltage level is 1.0V, though other embodiments may employ different VDD voltage levels depending on, for example, the particular process technology For read operations, the sensing signal Vsig is defined according to $$Vsig = \frac{1}{2} VDD \times \frac{C_S}{C_S + C_{BL}}$$

For the CIM memory array disclosed herein, bit lines may be shortened to optimize cell array access times. The BL length may depend on, for example, the size of the memory array (i.e. 8, 16, 256, etc. rows), and it may be optimized for different weight density and/or energy requirements. By keeping the bit line length short, then the bit line capacitance CBL is negligible and accordingly, the sensing signal Vsig level will be large (nearly ½ VDD) resulting in fast sensing and fast access times.

The corresponding sense amplifier 122 is selected though the control circuits 120 in response to the GROUP_EN signal, and the differential signal from the selected BL/BLB pair is sensed by the sense amplifier 122 and output to the corresponding MUX 124. The sense amplifier 122 output is provided to the multiply circuits 130, where the CIM input signal IN is combined with the CIM weight signal.

For write operations, a word line and bit line are selected based on an address received by the row select circuit 102 and the column select circuit 104. The word line WL of a desired row is activated, and the sense amplifier 122 is disabled by the control circuit 120. The logic 0 or 1 is then written for a selected column by driving the appropriate bit line BL/BLB to the desired high or low voltage state, thus causing the associated bit line BL/BLB to charge or discharge the storage capacitor 204 of the memory cell 200 to the desired value.

Figure 4:
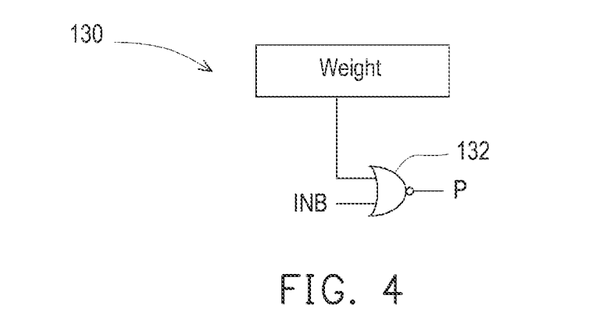
FIG. 4 is a schematic diagram illustrating an example of a multiply circuit accordance with some embodiments.
Figure 5:
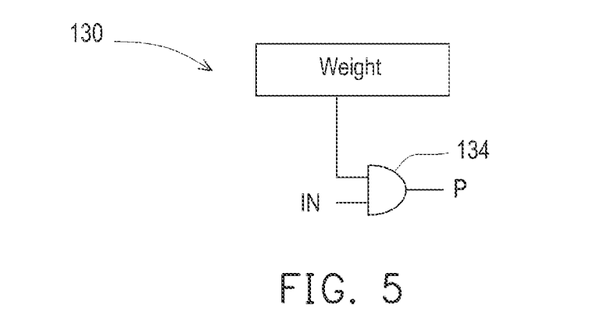
FIG. 5 is a schematic diagram illustrating an example of another multiply circuit accordance with some embodiments.

As noted above, weight data read from the memory cells 200 are output by the MUXs 124 to the multiply circuits 130 such that the CIM weight signals are multiplied by the input signal IN. The multiply circuits 130 are configured to multiply the input signal IN and the weight signals W read from the array 100. FIG. 4 illustrates an example of the multiply circuit 130 that includes a NOR gate 132 that receives the weight signal W from the memory array 100, along with the inverted input signal INB to output a product P of the weight signal W and the input signal IN. FIG. 5 illustrates another example in which the multiplier circuit 130 includes an AND gate 134 that receives the weight signal W from the memory array 100, along with the input signal IN from the array 100 to output a product P of the weight signal W and the input signal IN. The product output of the multiply circuit 130 is provided to a one IO adder circuit 140.

Figure 6:
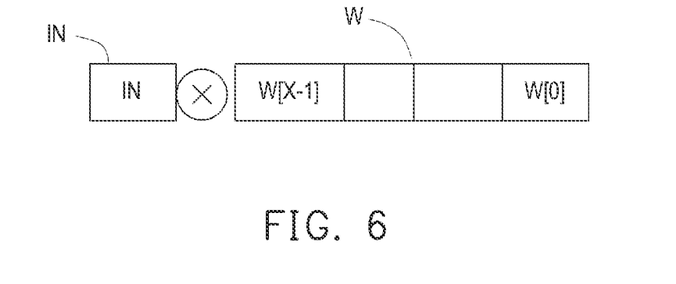
FIG. 6 is a block diagram illustrating an example of a CIM input and weight multiply operation in accordance with some embodiments.

In some examples, the multiply circuit 130 is configured to perform a bit-serial multiplication of the input IN and the weight W from a most significant bit of the input to a least significant bit of the input, thus producing a plurality of partial-products. (Other multiply configurations are within the scope of this disclosure.) FIG. 6 illustrates an example where a 1-bit CIM input signal IN is multiplied by an X-bit (X is a positive integer) CIM weight signal W[X-1:0]. The partial products are output to an accumulator of the one IO adder circuit 140.

Figure 7:
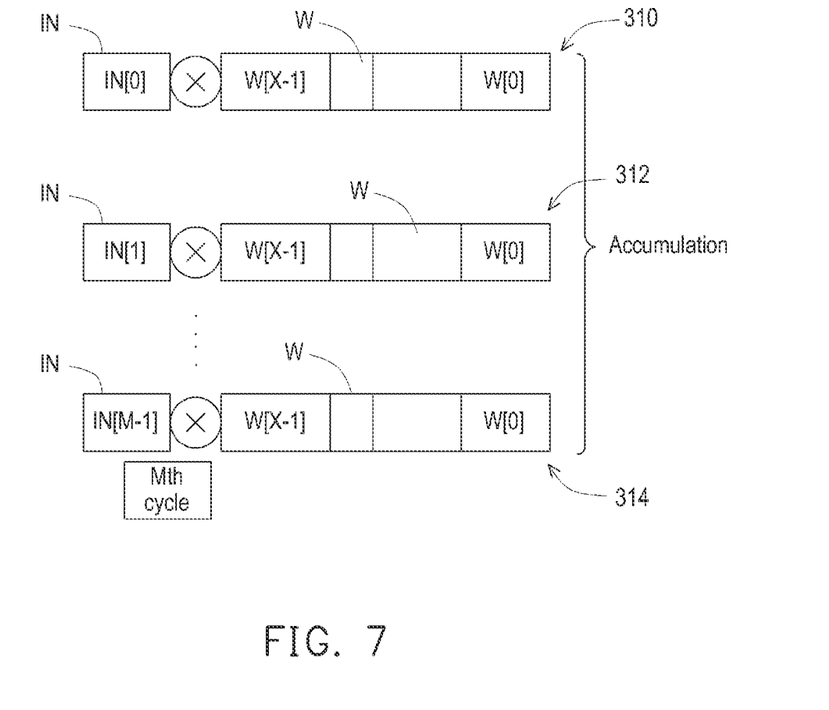
FIG. 7 is a block diagram illustrating an example of a CIM input and weight multiply and accumulate operation in accordance with some embodiments.

An example of such an implementation is shown in FIG. 7, illustrating the input IN[M-1:0] and the weight W[X-1:0]. As shown in FIG. 7, during the first cycle, the input IN[0] is multiplied by the weight W[X-1:0] to produce a first partial-product 310, during the second cycle the input IN[1] is multiplied by the weight W[X-1:0] to produce a second partial-product 312, and so on until the Mth cycle the input IN[M-1] is multiplied by the weight W[X-1:0] to produce an Mth partial-product 314. The partial-products 310-314 are then added or accumulated by the accumulator of the one IO adder circuit 140.

As noted above, disclosed examples provide multiple memory array groups that are independently selectable, allowing multitasking operations to provide increased weight storage array write throughput. For example, the memory array 100 shown in FIG. 2 includes a first storage array group 110-1 that includes the even columns of the memory array 100, and a second storage array group 110-2 that includes the odd columns of the memory array 100.

Figure 8:
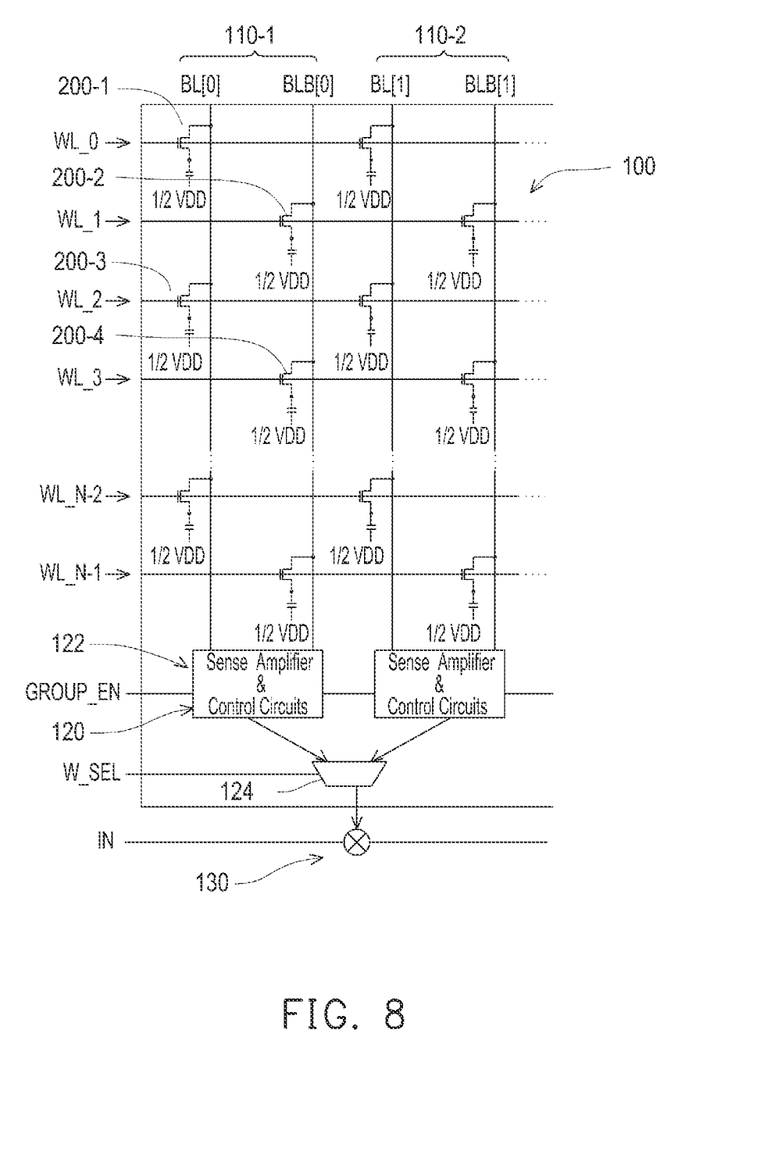
FIG. 8 is a schematic diagram illustrating an example of two selectable array groups of a CIM memory array in accordance with some embodiments.

FIG. 8 illustrates one column of the even group 110-1 and one column of the odd group 110-2. In FIG. 8, only one column for each of the array groups 110-1 and 110-2 is illustrated, though an actual implementation would have several columns for each of the memory array groups 110-1 and 110-2. The desired memory array group 110 is selected in response to the GROUP_EN signal received by the control circuit 120. In the embodiment illustrated in FIG. 8, a one bit GROUP_EN signal (0,1) is used to select between the two memory array groups 110-1, 110-2. For example, the desired CIM weight data may be written to the memory cells 200 of the even group 110-1 and/or the odd group 110-2 based on the GROUP_EN signal. Further, this arrangement facilitates multitasking operations, such as writing weight data to the even group 110-1 while reading data from the odd group 110-2. For example, a desired word line such as WL_0 may be activated, and data may be read from the even group 110-1 and written to the odd group 110-2 at same bit line power supply and word line power supply.

Figure 9:
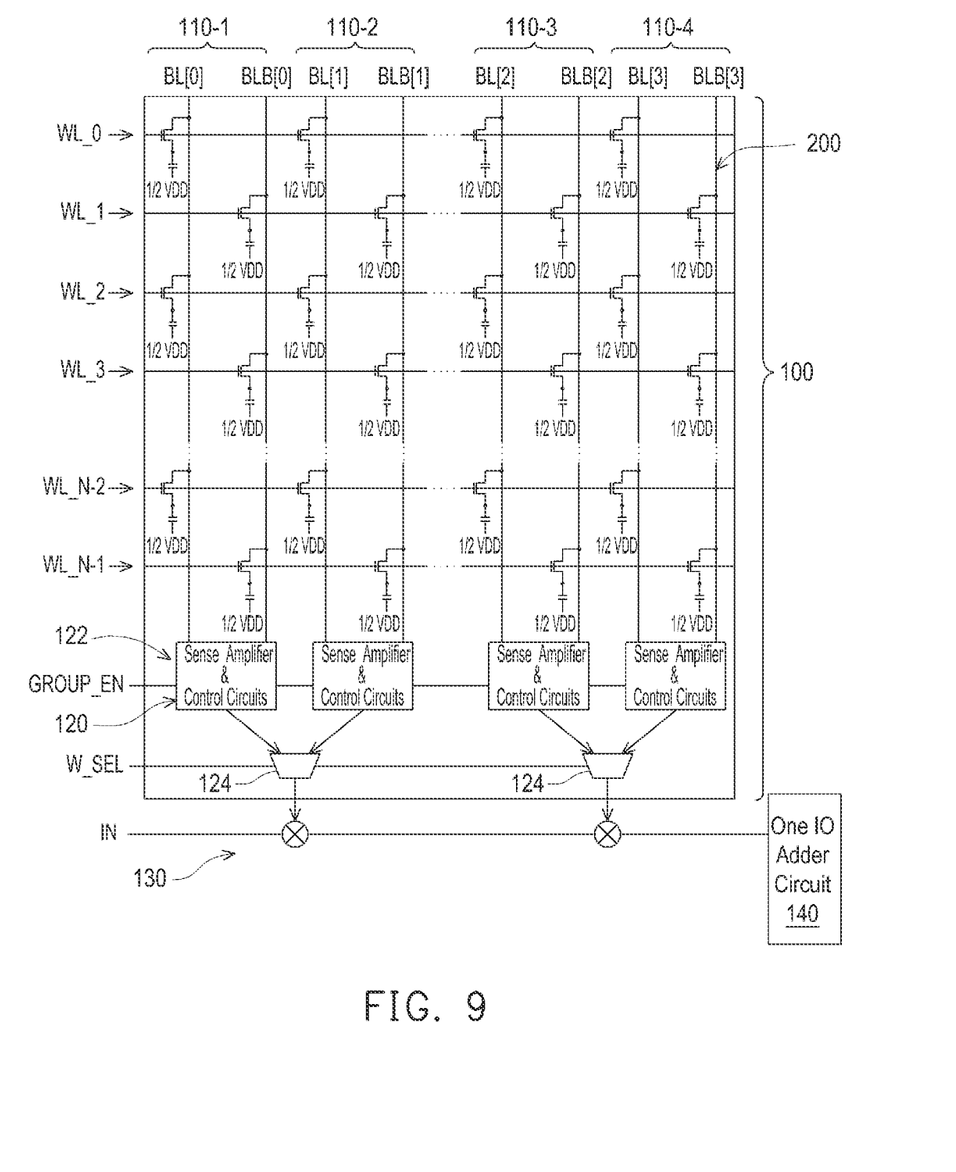
FIG. 9 is a schematic diagram illustrating an example of four selectable array groups of a CIM memory array in accordance with some embodiments.

FIG. 9 illustrates a further embodiment having four memory array groups 110-1, 110-2, 110-3, 110-4. In FIG. 9, only one column for each of the array groups is illustrated. An actual implementation would have several columns for each of the memory array groups 110-1, 110-2, 110-3, 110-4. With four memory array groups, a two bit GROUP_EN[1:0] is used to select among the four memory groups.

As with the example shown in FIG. 8, the provision of multiple array groups facilitates multi-tasking operations and increases CIM weight storage array write throughput. For example, in some embodiments four operations may be simultaneously conducted for the four array groups 110-1, 110-2, 110-3, 110-4, such as a read operation to one group with write operations to the other three groups. For instance, data may be read from the first group 110-1, while data is written to the second, third, and fourth groups 110-2, 110-3, 110-4 by selecting the desired word line and columns of the array 100 and activating the appropriate sense amplifiers 122 by the control circuit 120. Multiple simultaneous CIM weight data write operations further increases write throughput for the memory array, and can improve CIM efficiency. In further embodiments, more than two or four memory array groups may be provided.

Figure 10:
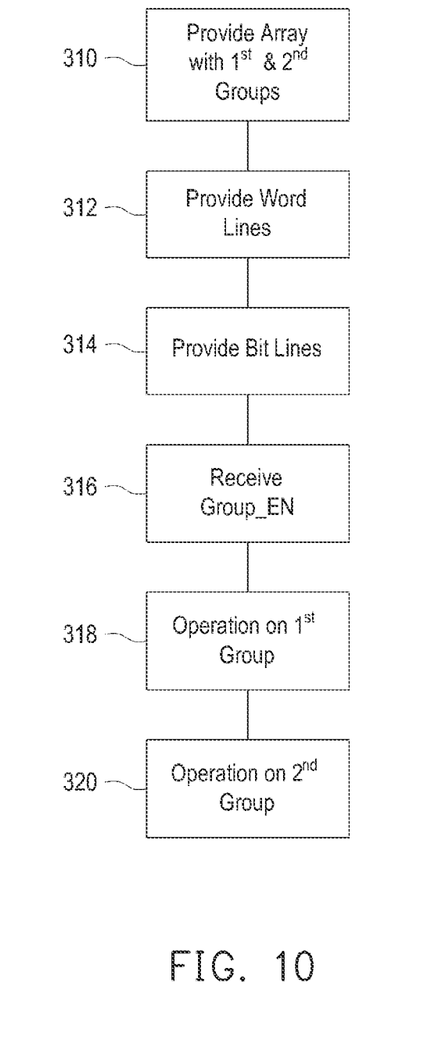
FIG. 10 is a flow diagram illustrating a CIM method in accordance with some embodiments.

FIG. 10 illustrates an example of a CIM method in accordance with disclosed embodiments. The method of FIG. 10 includes an operation 310 in which a memory array, such as the array 100 shown in FIG. 2 is provided. As discussed above, the memory array includes a plurality of memory cells 200 arranged in rows and columns, and the array has a first group 110-1 of memory cells and a second group 110-2 of memory cells. As indicated in operation 312, a plurality of word lines WL are provided, where each row of the array 100 has a corresponding word line WL with each memory cell 200 of a row of the array 100 being coupled to the corresponding word line WL. In operation 314, a plurality of bit lines are provided, where each column of the array 100 has a corresponding bit line BL/BLB with each memory cell 200 of a column of the array 100 being coupled to the corresponding bit line BL/BLB. A group enable signal GROUP_EN is received at operation 316. At operation 318, a first operation (such as a read operation) is performed on the first group of memory cells in response to the group enable signal, and at operation 320, a second operation (such as a write operation) is performed on the second group of memory cells in response to the group enable signal. In some examples, the first operation 318 and the second operation 320 are performed simultaneously or substantially simultaneously. Further, in some embodiments the first operation 318 and the second operation 320 are performed on memory cells 200 in the same selected word line WL. CIM weight data read from the memory cells 200 may then be multiplied by CIM input signals by a multiply circuit.

In accordance with aspects disclosed herein, limitations of conventional weight storage arrangements for CIM such as limited weight storage density limited write throughput are addressed. Among other things, disclosed embodiments include a 1T-1C based weight storage for CIM which may increase weight storage density by using a small area memory cell and further may increase weight storage array write throughput by employing multitasking for the memory array.

Disclosed embodiments thus include a memory device for CIM with a memory array including a plurality of memory cells arranged in an array of rows and columns. The memory cells have a first group of memory cells and a second group of memory cells. Each row of the array has a corresponding word line, with each memory cell of a row of the array coupled to the corresponding word line. Each column of the array has a corresponding bit line, with each memory cell of a column of the array coupled to the corresponding bit line. A control circuit is configured to select the first group of memory cells or the second group of memory cells in response to a group enable signal.

In accordance with further aspects, a CIM device includes a plurality of memory cells configured to store weight signals. The memory cells are arranged in an array of rows and columns that include a first group of memory cells and a second group of memory cells. Each row of the array has a corresponding word line, with each memory cell coupled to the corresponding word line. Each column of the array has a corresponding bit line, with each memory cell coupled to the corresponding bit line. A sense amplifier is coupled to the bit lines and is configured to amplify signals of the bit lines for reading operations. A control circuit is connected to the bit lines and is configured to select the first group of memory cells or the second group of memory cells in response to a group enable signal. An input terminal configured to receive an input signal, and a multiply circuit configured to multiply the weight signals by the input signal to generate a plurality of partial products.

In accordance with still further disclosed aspects, a CIM method includes providing a memory array having a plurality of memory cells arranged in an array of rows and columns. The memory cells include a first group of memory cells and a second group of memory cells. A plurality of word lines are provided, with each memory cell of a row of the array coupled to a corresponding word line. A plurality of bit lines are provided, with each memory cell of a column of the array coupled to the corresponding bit line. A group enable signal is received, and a first operation is performed on the first group of memory cells in response to the group enable signal, and a second operation is performed on the second group of memory cells in response to the group enable signal.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device for compute-in-memory (CIM), comprising:
   a memory array including a plurality of memory cells arranged in an array of rows and columns, the memory cells including a first group of memory cells and a second group of memory cells;
   a plurality of word lines, each row of the array having a corresponding word line, each memory cell of a row of the array coupled to the corresponding word line;
   a plurality of bit lines, each column of the array having a corresponding bit line, each memory cell of a column of the array coupled to the corresponding bit line;
   a control circuit configured to select the first group of memory cells and/or the second group of memory cells in response to a group enable signal;
   an input terminal configured to receive a CIM input signal; and
   a multiply circuit configured to receive weight signals stored in the selected group of memory cells and multiply the weight signals by the CIM input signal to generate a plurality of partial products.

2. The memory device of claim 1, further comprising:
   a first sense amplifier coupled to the bit lines of the first group of memory cells; and
   a second sense amplifier coupled to the bit lines of the second group of memory cells.

3. The memory device of claim 2, further comprising a multiplexer (MUX) connected to the first sense amplifier and the second sense amplifier.

4. The memory device of claim 3, wherein the multiply circuit is connected to an output terminal of the MUX.

5. The memory device of claim 1, wherein each of the memory cells includes one transistor and one capacitor for forming a one-transistor one capacitor (1T-1C) memory cell.

6. The memory device of claim 5, wherein the transistor of the 1T-1C memory cell includes a gate terminal connected to its respective word line.

7. The memory device of claim 5, wherein the transistor of the 1T-1C memory cell includes:
   a first source/drain (S/D) terminal connected to its respective bit line; and
   a second source/drain (S/D) terminal connected to a first terminal of the capacitor of the 1T-1C memory cell.

8. The memory device of claim 5, wherein the memory array includes a power input terminal configured to receive a VDD voltage, and wherein the capacitor of the 1T-1C memory cell includes a second terminal connected to receive a half VDD voltage.

9. The memory device of claim 1, wherein the memory cells further include a third group of memory cells and a fourth group of memory cells.

10. The memory device of claim 9, wherein the control circuit is configured to select the first and third groups of memory cells or the second and fourth groups of memory cells in response to a one-bit group enable signal.

11. The memory device of claim 9, wherein the control circuit is configured to select the first group, the second group, the third group or the fourth group of memory cells in response to a two-bit group enable signal.

12. The memory device of claim 1, wherein the control circuit includes:
    a first control circuit connected to the bit lines of a first column of the memory array; and
    a second control circuit connected to the bit lines of a second column of the memory array.

13. A compute in memory (CIM) device, comprising:
    a plurality of memory cells configured to store weight signals, the memory cells arranged in an array of rows and columns including a first group of memory cells and a second group of memory cells;
    a plurality of word lines, each row of the array having a corresponding word line, each memory cell coupled to the corresponding word line;
    a plurality of bit lines, each column of the array having a corresponding bit line, each memory cell coupled to the corresponding bit line;
    a sense amplifier coupled to the bit lines and configured to amplify signals of the bit lines for reading operations;
    a control circuit connected to the bit lines and configured to select the first group of memory cells or the second group of memory cells in response to a group enable signal;

an input terminal configured to receive a CIM input signal; and a multiply circuit configured to multiply the weight signals by the CIM input signal to generate a plurality of partial products.

14. The CIM device of claim 13, further comprising a multiplexer (MUX) connected to the sense amplifier.

15. The CIM device of claim 13, wherein each of the memory cells includes one transistor and one capacitor for forming a one-transistor one capacitor (1T-1C) memory cell.

16. The CIM device of claim 13, wherein the memory cells further include a third group of memory cells and a fourth group of memory cells.

17. The CIM device of claim 13, further comprising a one IO adder tree circuit configured to add the plurality of partial products.

18. A method, comprising:

providing a memory array having a plurality of memory cells arranged in an array of rows and columns, the memory cells including a first group of memory cells and a second group of memory cells;

providing a plurality of word lines, each row of the array having a corresponding word line, each memory cell of a row of the array coupled to the corresponding word line;

providing a plurality of bit lines, each column of the array having a corresponding bit line, each memory cell of a column of the array coupled to the corresponding bit line;

receiving a group enable signal;

performing a first operation on the first group of memory cells in response to the group enable signal;

performing a second operation on the second group of memory cells in response to the group enable signal;

writing compute in memory (CIM) weight signals to the memory cells;

reading the CIM weight signals from the memory cells;

receiving a CIM input signal; and multiplying the CIM input signal by the CIM weight signals by a multiply circuit.

19. The method of claim 18, wherein the first operation is a read operation and the second operation is a write operation.

20. The method of claim 18, wherein the first operation and the second operation are performed simultaneously.

* * * * *